US010862474B2

United States Patent
Hsu et al.

(10) Patent No.: US 10,862,474 B2
(45) Date of Patent: Dec. 8, 2020

(54) TRANSMISSION GATE CIRCUIT

(71) Applicant: REALTEK SEMICONDUCTOR CORPORATION, Hsinchu (TW)

(72) Inventors: Hsin-Cheng Hsu, Hsinchu County (TW); Tay-Her Tsaur, Hsinchu County (TW); Po-Ching Lin, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/716,586

(22) Filed: Dec. 17, 2019

(65) Prior Publication Data

US 2020/0195243 A1 Jun. 18, 2020

(30) Foreign Application Priority Data

Dec. 18, 2018 (TW) .............................. 107145733 A

(51) Int. Cl.
*H03K 17/00* (2006.01)
*H03K 17/10* (2006.01)
*H03K 17/0812* (2006.01)

(52) U.S. Cl.
CPC ..... *H03K 17/102* (2013.01); *H03K 17/08122* (2013.01)

(58) Field of Classification Search
CPC .............. H03K 17/693; H03K 17/6872; H03K 17/04123; H03K 17/1737; H03K 17/102; H03K 17/08122; G05F 3/222; G05F 3/265; G06F 17/505
See application file for complete search history.

(56) References Cited

U.S. PATENT DOCUMENTS 6,605,977 B2 * 8/2003 Martini ................ H03K 17/162
326/113
9,094,008 B2 * 7/2015 Lee ...................... H03K 17/102

OTHER PUBLICATIONS

OA letter of counterpart TW application of application No. 107145733 dated Feb. 27, 2019. Summary of TW OA letter: Claim 1-10 are rejected as being unpatentable over the cited reference 1 (U.S. Pat. No. 9,094,008 B2).

* cited by examiner

*Primary Examiner* — Long Nguyen
(74) *Attorney, Agent, or Firm* — WPAT, PC

(57) ABSTRACT

Disclosed is a transmission gate circuit including a control voltage generating circuit, a high voltage transmission circuit and a low voltage transmission circuit. The high and low voltage transmission circuits are coupled between an input terminal and an output terminal. The control voltage generating circuit generates two voltage groups according to an input voltage of the input terminal and an enable voltage and thereby controls the high and low voltage transmission circuits with the two voltage groups respectively. When the enable voltage is high, one voltage group includes identical voltages while a difference between any of the identical voltages and any voltage of the other voltage group is not higher than a predetermined voltage; when the enable voltage is low, each voltage group includes decremental voltages. The high/low voltage transmission circuit is turned on when the enable voltage is high and the input voltage is high/low.

18 Claims, 9 Drawing Sheets

TRANSMISSION GATE CIRCUIT

BACKGROUND OF THE INVENTION

1. Field of the Invention

The present invention is related to a transmission gate circuit, especially to a transmission gate circuit capable of preventing the components of the transmission gate circuit from being damaged by a high voltage.

2. Description of Related Art

FIG. 1 shows a conventional CMOS transmission gate circuit. The transmission gate circuit 100 of FIG. 1 includes an inverter 110 and a transmission gate 120. The inverter 110 is coupled between a high power-supply voltage terminal and a low power-supply voltage terminal; the inverter 110 is configured to output a low power-supply voltage $V_{SS}$ when an enable signal EN is high (e.g., when the enable signal EN is equal to the voltage $V_{DD}$ of the high power-supply voltage terminal) and to output a high power-supply voltage $V_{DD}$ when the enable signal EN is low (e.g., when the enable signal EN is equal to the voltage $V_{SS}$ of the low power-supply voltage terminal). The transmission gate 120 is configured to be turned on when the enable signal EN is high so as to have the signal $V_{OUT}$ of an output terminal be equal to the signal $V_{IN}$ of an input terminal; the transmission gate 120 is also configured to be turned off when the enable signal EN is low so as to have the signal $V_{OUT}$ of the output terminal is a floating signal. In detail, the transmission gate 120 includes a PMOS transistor 122 and an NMOS transistor 124; the gate of the PMOS transistor 122 receives the output voltage of the inverter 110 and the gate of the NMOS transistor 124 receives the enable signal EN. Accordingly, when the enable signal EN is high, the output voltage of the inverter 110 is low (e.g., $V_{SS}$); consequently the PMOS transistor 122 is turned on according to its low gate voltage (i.e., the output voltage of the inverter 110) when the input voltage $V_{IN}$ is a high level voltage (e.g., $V_{DD}$), and the NMOS transistor 124 is turned on according to its high gate voltage (i.e., the enable signal EN) when the input voltage $V_{IN}$ is a low level voltage (e.g., $V_{SS}$). Furthermore, when the enable signal EN is low, the output voltage of the inverter 110 is high (i.e., $V_{DD}$); consequently, both the PMOS transistor 122 and the NMOS transistor 124 are turned off. In light of the above, the transmission gate 100 can act as a switch.

As the CMOS technology develops, the size of transistor is shrunk for the reduction of circuit area so that the operation speed is increased and the power consumption is reduced. However, as the size of a transistor is shrunk, the gate oxide layer and the channel length of the transistor are also shrunk, and thus the maximum allowable voltage drop (a.k.a. nominal voltage) between any two terminals of the transistor (e.g., any two of the gate, drain, source, and base of the transistor) becomes smaller. If the voltage difference between any two terminals of a transistor is higher than the nominal voltage, the transistor is likely to be damaged. Since the nominal voltage of a transistor manufactured with an advanced CMOS process trends down, the design of a conventional CMOS transmission gate circuit (e.g., the transmission gate circuit 100 of FIG. 1) made of that kind of transistors may be damaged in a circumstance that a high power-supply voltage $V_{DD}$ is higher than the nominal voltage of the transistors.

In addition, the transmission gate circuit 100 of FIG. 1 has another problem. When the enable signal EN is low, the PMOS transistor 122 and the NMOS transistor 124 should not be turned on; in other words, the transmission gate 120 should be turned off. However, if a power failure occurs (i.e., the high power-supply voltage $V_{DD}$=0), the gate signal of the PMOS transistor 122 is a floating signal which cannot turn off the PMOS transistor 122; in this case, the signal $V_{IN}$ of the input terminal of the transmission gate 120 is leaked to the output terminal of the transmission gate 120 via the PMOS transistor 122.

SUMMARY OF THE INVENTION

An object of the present invention is to provide a transmission gate circuit capable of preventing the components of the transmission gate circuit from being damaged by a high voltage.

Another object of the present invention is to provide a transmission gate circuit capable of preventing a signal of the input terminal of the transmission gate circuit from being leaked to the output terminal of the transmission gate circuit.

An embodiment of the transmission gate circuit of the present invention includes a control voltage generating circuit, a high voltage transmission circuit (e.g., PMOS circuit), and a low voltage transmission circuit (e.g., NMOS circuit), in which the high voltage transmission circuit and low voltage transmission circuit are coupled between an input terminal and an output terminal. The control voltage generating circuit is configured to generate a plurality of control voltages according to an enable signal and an input voltage of the input terminal, wherein the plurality of control voltages include a first group of control voltages and a second group of control voltages. When the enable signal relates to an enable level, one group of the first group of control voltages and the second group of control voltages includes identical voltages while a voltage difference between any of the identical voltages and any voltage of the other group of the first group of control voltages and the second group of control voltages is not higher than a predetermined voltage; and when the enable signal relates to a disablement level, each group of the first group of control voltages and the second group of control voltages includes decremental voltages. When the enable signal relates to the enable level (e.g., high voltage level) and the input voltage is a high level voltage, the high voltage transmission circuit is turned on according to the first group of control voltages including the identical voltages and has an output voltage of the output terminal be equal to the input voltage of the input terminal; and when the enable signal relates to the disablement level (e.g., low voltage level), the high voltage transmission circuit is turned off according to the first group of control voltages. When the enable signal relates to the enable level and the input voltage is a low level voltage, the low voltage transmission circuit is turned on according to the second group of control voltages including the identical voltages and has the output voltage of the output terminal be equal to the input voltage of the input terminal; and when the enable signal relates to the disablement level, the low voltage transmission circuit is turned off according to the second group of control voltages.

Another embodiment of the transmission gate circuit of the present invention includes a control voltage generating circuit, a high voltage transmission circuit (e.g., PMOS circuit), and a low voltage transmission circuit (e.g., NMOS circuit), in which the high voltage transmission circuit and low voltage transmission circuit are coupled in parallel and coupled between an input terminal and an output terminal. The control voltage generating circuit is configured to generate a plurality of control voltages according to an enable signal and an input voltage of the input terminal, wherein the plurality of control voltages include a first group of control voltages and a second group of control voltages. When the enable signal relates to an enable level (e.g., high voltage level) and the input voltage is a high level voltage, the high voltage transmission circuit is turned on according to the first group of control voltages so that an output voltage of the output terminal is equal to the input voltage of the input terminal while the low voltage transmission circuit is turned off according to the second group of control voltages; and when the enable signal relates to a disablement level, the high voltage transmission circuit is turned off according to the first group of control voltages. When the enable signal relates to the enable level and the input voltage is a low level voltage, the low voltage transmission circuit is turned on according to the second group of control voltages so that the output voltage of the output terminal is equal to the input voltage of the input terminal while the high voltage transmission circuit is turned off according to the first group of control voltages; and when the enable signal relates to the disablement level, the low voltage transmission circuit is turned off according to the second group of control voltages.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this technical field. If any term is defined in the following description, such term should be interpreted accordingly.

The present disclosure includes a transmission gate circuit capable preventing the components of the transmission gate circuit from being damaged by a high voltage (e.g., high power-supply voltage and/or high input voltage) and preventing a signal of the input terminal of the transmission gate circuit from being leaked to the output terminal of the transmission gate circuit during a power failure (e.g., during the voltage of a high power-supply voltage terminal being zero).

Figure 1:
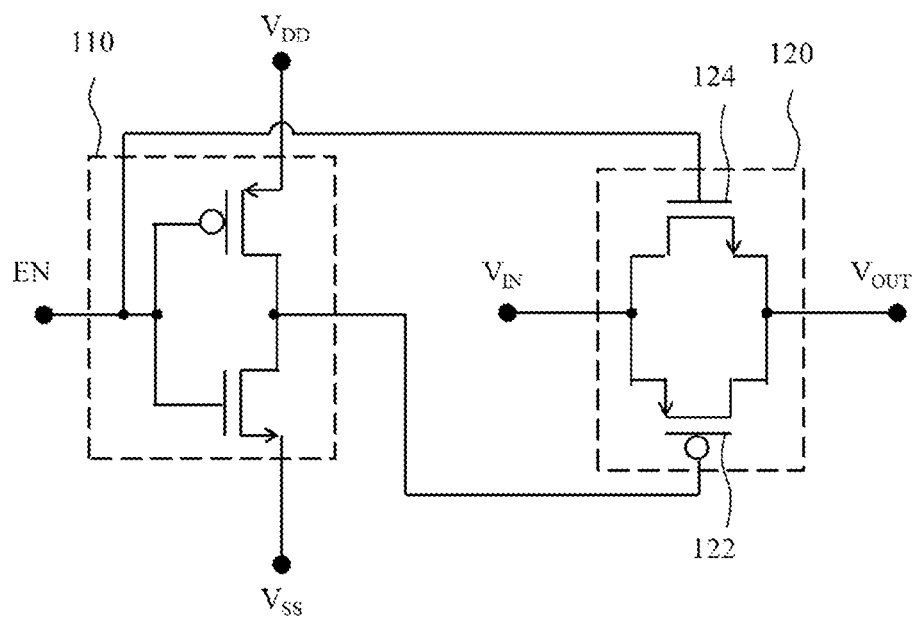
FIG. 1 shows a conventional transmission gate circuit.
Figure 2:
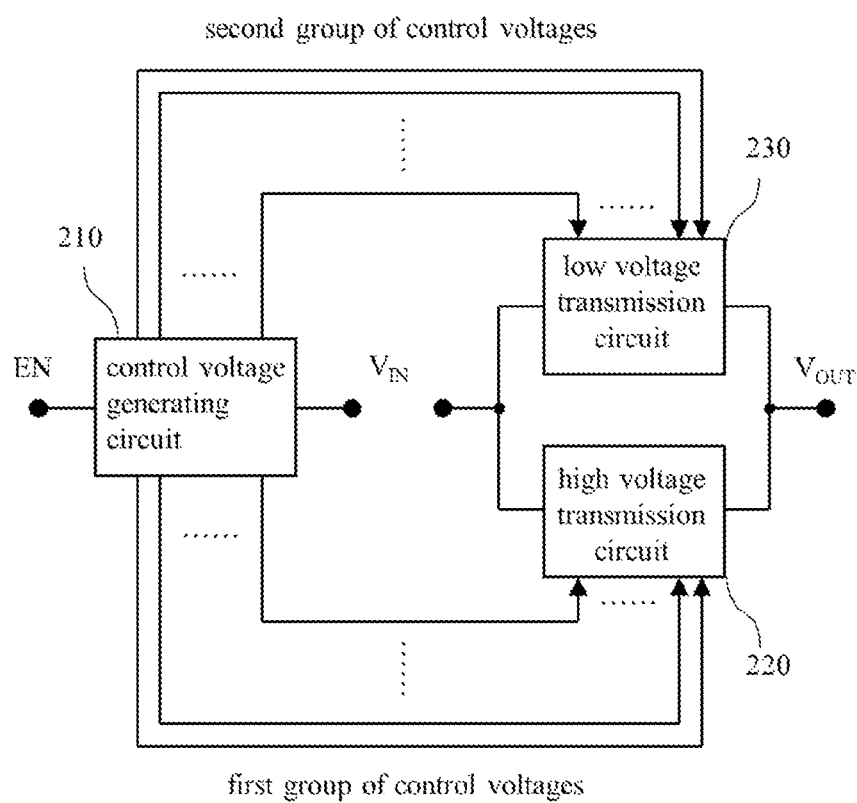
FIG. 2 shows an embodiment of the transmission gate circuit of the present invention.

FIG. 2 shows an embodiment of the transmission gate circuit of the present invention. The transmission gate circuit 200 of FIG. 2 includes a control voltage generating circuit 210, a high voltage transmission circuit 220, and a low voltage transmission circuit 230. The high voltage transmission circuit 220 and low voltage transmission circuit 230 are coupled in parallel, and coupled between an input terminal and an output terminal. The voltage of the input terminal is $V_{IN}$ and the voltage of the output terminal is $V_{OUT}$.

Please refer to FIG. 2. The control voltage generating circuit 210 is configured to generate a plurality of control voltages according to the input voltage $V_{IN}$ and an enable signal EN. The plurality of control voltages include a first group of control voltages and a second group of control voltages. When the enable signal EN relates to an enable level (e.g., high voltage level), one group of the first group of control voltages and the second group of control voltages includes identical voltages while the other group includes voltages being the same or slightly different from each other. More specifically, when one group of the first group of control voltages and the second group of control voltages includes the identical voltages, a voltage difference between any voltage of the other group and the input voltage $V_{IN}$ is not higher than a predetermined voltage. The predetermined voltage is a nominal voltage here, but not limited thereto. When the enable signal EN relates to a disablement level (e.g., low voltage level), each group of the first group of control voltages and second group of control voltages includes decremental voltages (e.g., $V_{DD}$, ($V_{DD}-V_{NOMINAL}$), ($V_{DD}-2\times V_{NOMINAL}$), . . . , [$V_{DD}-(N-1)\times V_{NOMINAL}$], and $V_{SS}$, in which $V_{DD}$ is a high power-supply voltage, $V_{SS}$ is a low power-supply voltage, the N is an integer greater than one, and the equation $\{[V_{DD}-(N-1)\times V_{NOMINAL}]-V_{SS}\} \leq V_{NOMINAL}$ is held true; or $V_{DD}$, [$V_{SS}+(N-1)\times V_{NOMINAL}$], . . . , ($V_{SS}+2\times V_{NOMINAL}$), ($V_{SS}+V_{NOMINAL}$), and $V_{SS}$, in which the equation $\{V_{DD}-[V_{SS}+(N-1)\times V_{NOMINAL}]\} \leq V_{NOMINAL}$ is held true). It should be noted that the decremental voltages of the first group of control voltages can be the same as or different from the decremental voltages of the second group of control voltages.

Figure 3:
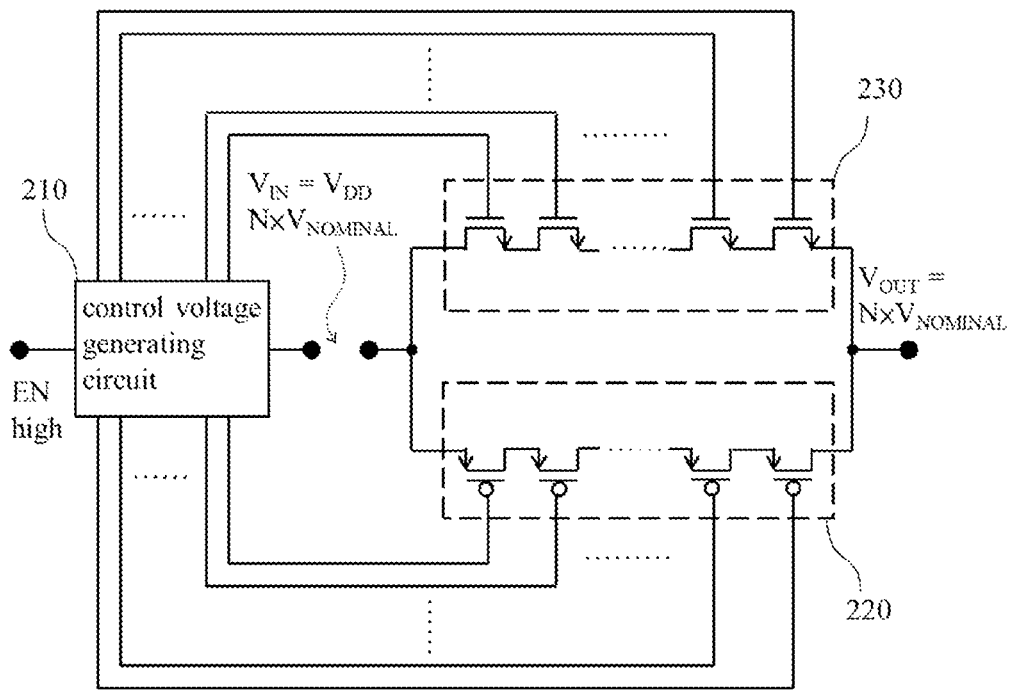
FIG. 3 shows an exemplary implementation of the embodiment of FIG. 2.

Please refer to FIG. 2. When the enable signal EN relates to the enable level and the input voltage $V_{IN}$ is a high level voltage which could be the high power-supply voltage $V_{DD}$, originate from the high power-supply voltage $V_{DD}$, or be any high voltage (e.g., $N\times V_{NOMINAL}$) applicable to this embodiment, the high voltage transmission circuit 220 is turned on according to the first group of control voltages so as to let the output voltage $V_{OUT}$ be the input voltage $V_{IN}$; meanwhile, the first group of control voltages include the aforementioned identical voltages (e.g., ($V_{DD}-V_{NOMINAL}$), in which when $V_{DD}$ is equal to $N\times V_{NOMINAL}$, each of the identical voltages is ($V_{DD}-V_{NOMINAL}$)=(N-1)$\times V_{NOMINAL}$ as shown in FIG. 3). For a better understanding, the high level voltage of this embodiment is $V_{DD}$, but not limited thereto.

Figure 4:
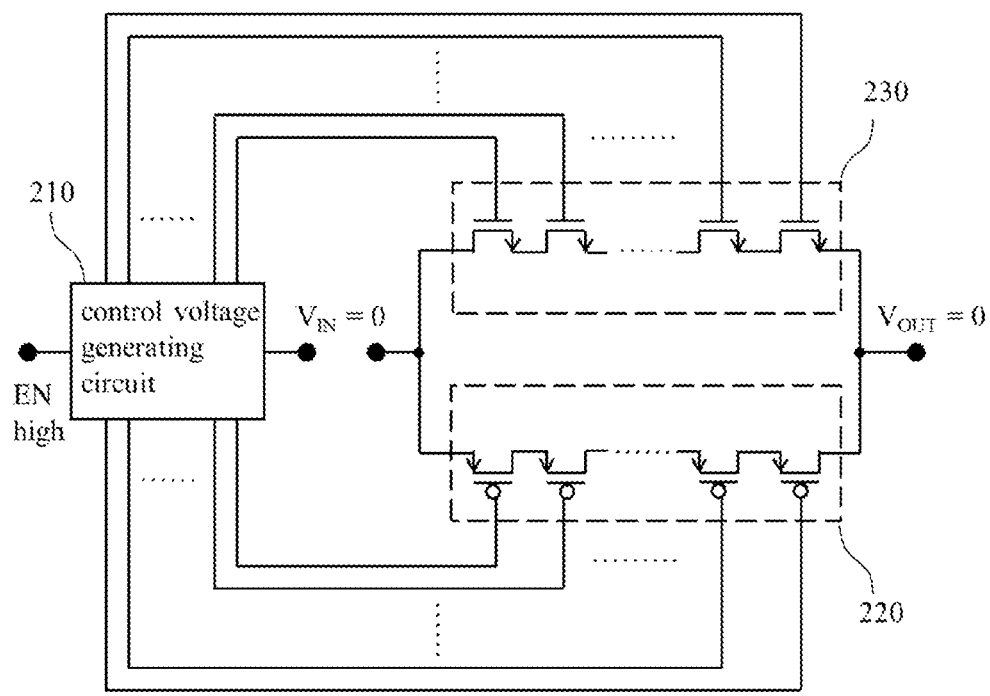
FIG. 4 shows an exemplary implementation of the embodiment of FIG. 2.

Please refer to FIG. 2. When the enable signal EN relates to the enable level and the input voltage $V_{IN}$ is a low level voltage which could be the low power-supply voltage $V_{SS}$, originate from the low power-supply voltage $V_{SS}$, or be any low voltage (e.g., zero volt) applicable to this embodiment, the low voltage transmission circuit 230 is turned on according to the second group of control voltages so as to let the output voltage $V_{OUT}$ be the input voltage $V_{IN}$; meanwhile, the second group of control voltages include the aforementioned identical voltages (e.g., [$V_{DD}-(N-1)\times V_{NOMINAL}$], in which when $V_{DD}=N\times V_{NOMINAL}$, each of the identical voltages is [$V_{DD}-(N-1)\times V_{NOMINAL}$]=$V_{NOMINAL}$ as shown in FIG. 4). For a better understanding, the low level voltage of this embodiment is $V_{SS}$, but not limited thereto.

Figure 5:
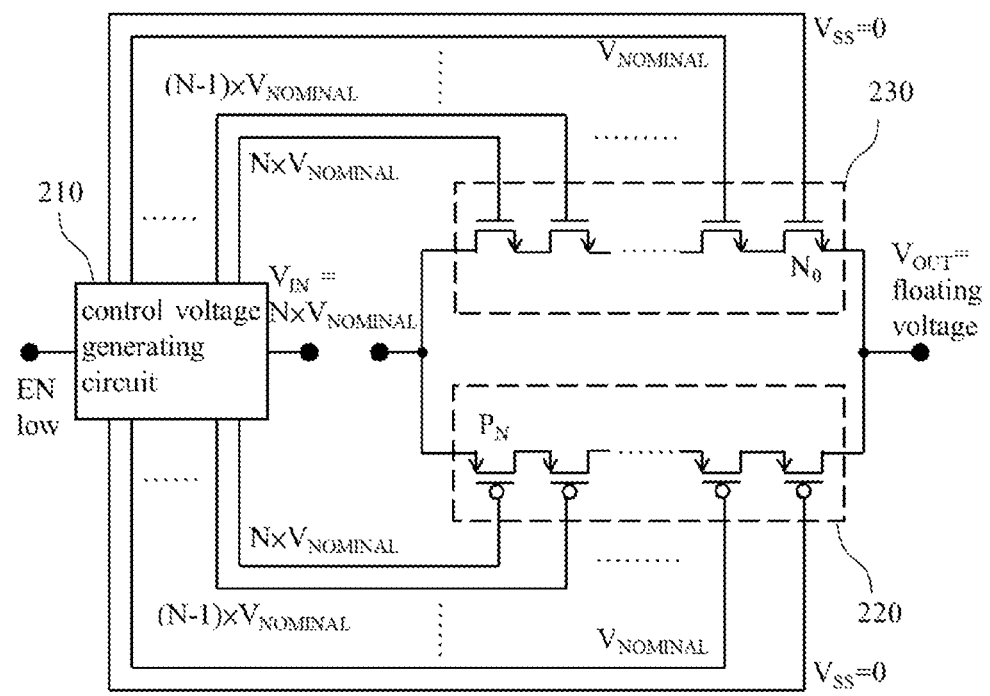
FIG. 5 shows an exemplary implementation of the embodiment of FIG. 2.
Figure 9:
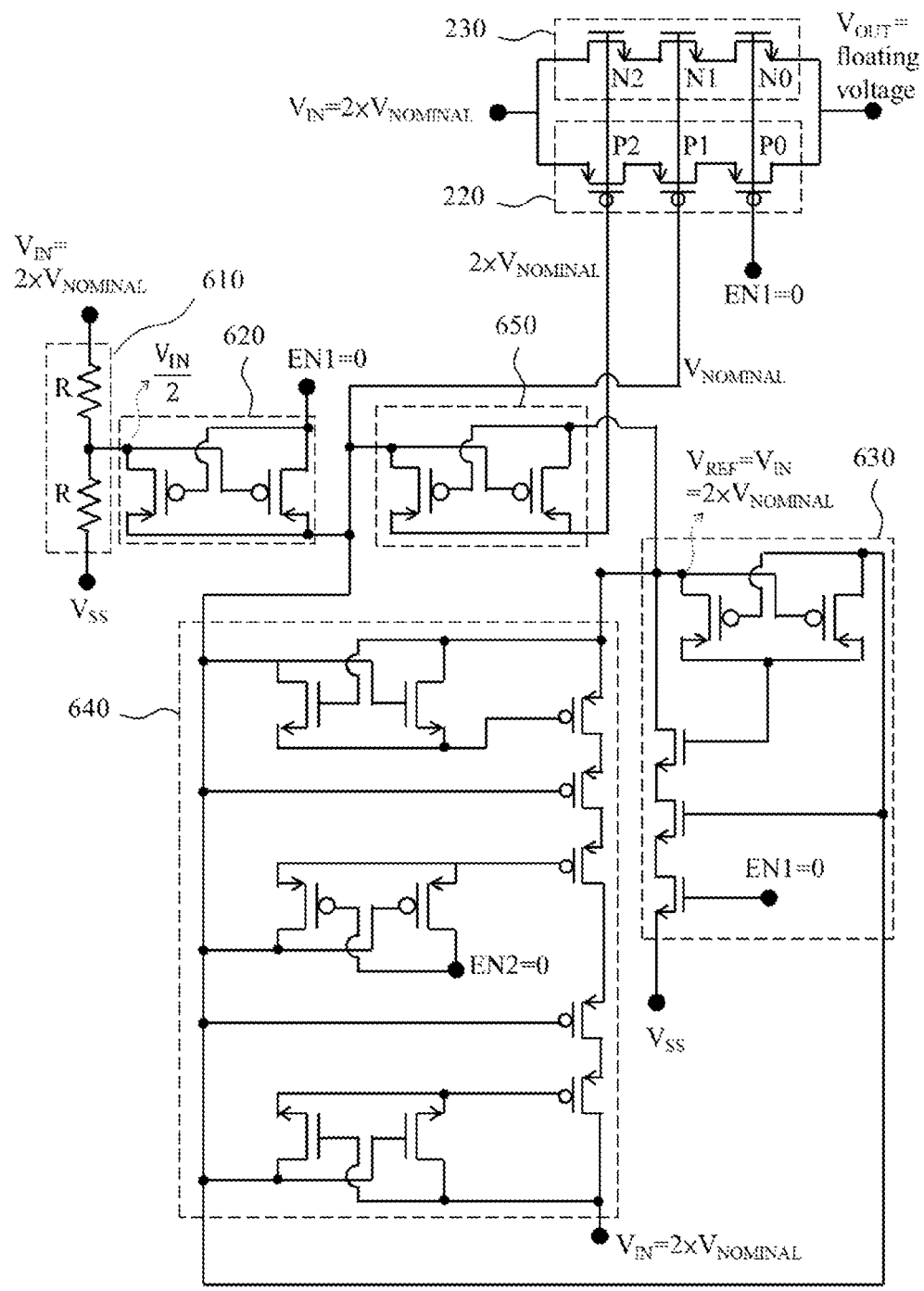
FIG. 9 shows an exemplary implementation of the embodiment of the FIG. 6.

Please refer to FIG. 2. When the enable signal EN relates to the disablement level, the first group of control voltages is equal to the second group of control voltages (as shown in FIG. 5 and FIG. 9), and the high level voltage $V_{DD}$ is between N times the nominal voltage $V_{NOMINAL}$ and (N+1) times the nominal voltage $V_{NOMINAL}$ (i.e., $N \times V_{NOMINAL} \leq V_{DD} \leq (N+1) \times V_{NOMINAL}$), in which the N is an integer greater than one. The high voltage transmission circuit 220 includes first-type transistors (e.g., PMOS transistors), the low voltage transmission circuit 230 includes second-type transistors (e.g., NMOS transistors), each of the first-type transistors and second-type transistors is limited to the nominal voltage $V_{NOMINAL}$, and if any of these transistors has a nominal voltage not higher than the nominal voltage of any of the other transistors, the smallest nominal voltage is treated as the nominal voltage $V_{NOMINAL}$ in this embodiment. The number of the first-type transistors of the high voltage transmission circuit 220 is (N+1), the number of the second-type transistors of the low voltage transmission circuit 230 is (N+1), and the N is an integer greater than one. Additionally, the voltage difference between any two terminals of each of the first-type transistors and second-type transistors is not higher than the nominal voltage $V_{NOMINAL}$, in which the base of each transistor can optionally be short-circuited to the source of the same transistor, or receive a voltage (e.g., a voltage identical/similar to the voltage of the source) generated by the control voltage generating circuit 210.

FIG. 3 shows an exemplary implementation of the embodiment of FIG. 2. In FIG. 3, the input voltage $V_{IN}$ is equal to $V_{DD}=N \times V_{NOMINAL}$, the enable signal EN relates to the enable level (e.g., EN is a high level voltage), the high voltage transmission circuit 220 includes a plurality of PMOS transistors, the low voltage transmission circuit 230 includes a plurality of NMOS transistors, and each of these PMOS and NMOS transistors is limited to the aforementioned nominal voltage $V_{NOMINAL}$. Additionally, the control voltage generating circuit 210 generates the first group of control voltages including the identical voltages being $(N-1) \times V_{NOMINAL}$, and generates the second group of control voltages including voltages being the same or slightly different from each other, in which each of the voltages being slightly different from each other is between $(N-1) \times V_{NOMINAL}$ and $N \times V_{NOMINAL}$. According to FIG. 3, since the input voltage $V_{IN}=N \times V_{NOMINAL}$ is higher than the gate voltage $(N-1) \times V_{NOMINAL}$ of the PMOS transistors, the PMOS transistors are turned on so that the output voltage $V_{OUT}$ is equal to the input voltage $V_{IN}=N \times V_{NOMINAL}$; furthermore, since the input voltage $V_{IN}=N \times V_{NOMINAL}$ is not lower than the gate voltage, that is between $(N-1) \times V_{NOMINAL} \sim N \times V_{NOMINAL}$, of the NMOS transistors, the NMOS transistors are turned off. In light of the above, the voltage difference of any two terminals of each transistor in FIG. 3 is not higher than the nominal voltage $V_{NOMINAL}$.

FIG. 4 shows an exemplary implementation of the embodiment of FIG. 2. In FIG. 4, the input voltage $V_{IN}$ is equal to $V_{SS}=0$, and the enable signal EN relates to the enable level. In this case, the control voltage generating circuit 210 generates the second group of control voltages including the identical voltages being $V_{SS}+V_{NOMINAL}=V_{NOMINAL}$, and generates the first group of control voltages being the same or slightly different from each other, in which each of the voltages being slightly different from each other is between $V_{NOMINAL} \sim V_{SS}$. According to FIG. 4, since the input voltage $V_{IN}=V_{SS}=0$ is lower than the gate voltage $V_{NOMINAL}$ of the NMOS transistors, the NMOS transistors are turned on so that the output voltage $V_{OUT}$ is equal to the input voltage $V_{IN}=V_{SS}=0$; furthermore, since the input voltage $V_{IN}=V_{SS}=0$ is not higher than the gate voltage, that is between $V_{NOMINAL} \sim V_{SS}$, of the PMOS transistors, the PMOS transistors are turned off. In light of the above, the voltage difference of any two terminals of each transistor in FIG. 4 is not higher than the nominal voltage $V_{NOMINAL}$.

FIG. 5 shows an exemplary implementation of the embodiment of FIG. 2. In FIG. 5, the input voltage $V_{IN}$ is equal to $V_{DD}=N \times V_{NOMINAL}$, the enable signal EN relates to the disablement level (e.g., EN is a low level voltage). In this case, the control voltage generating circuit 210 generates the first group of control voltages including the decremental voltages (i.e., $N \times V_{NOMINAL}$, $(N-1) \times V_{NOMINAL}$, $(N-2) \times V_{NOMINAL}$, ..., $V_{NOMINAL}$, and $V_{SS}=0$) as the gate voltages of the PMOS transistors respectively, and generates the second group of control voltages including the decremental voltages (i.e., $N \times V_{NOMINAL}$, $(N-1) \times V_{NOMINAL}$, $(N-2) \times V_{NOMINAL}$, ..., $V_{NOMINAL}$, and $V_{SS}=0$) as the gate voltages of the NMOS transistors respectively. According to FIG. 5, since the input voltage $V_{IN}=N \times V_{NOMINAL}$ is not higher than the maximum gate voltage $N \times V_{NOMINAL}$ of the PMOS transistors, at least one of the PMOS transistors (i.e., the PMOS transistor $P_N$ of FIG. 5) is turned off; furthermore, since the input voltage $V_{IN}=N \times V_{NOMINAL}$ is not lower than the minimum gate voltage $V_{SS}=0$ of the NMOS transistors, at least one of the NMOS transistors (i.e., the PMOS transistor $N_0$ of FIG. 5) is turned off. Accordingly, the output voltage $V_{OUT}$ is a floating voltage. In light of the above, the voltage difference of any two terminals of each transistor in FIG. 5 is not higher than the nominal voltage $V_{NOMINAL}$.

Figure 6:
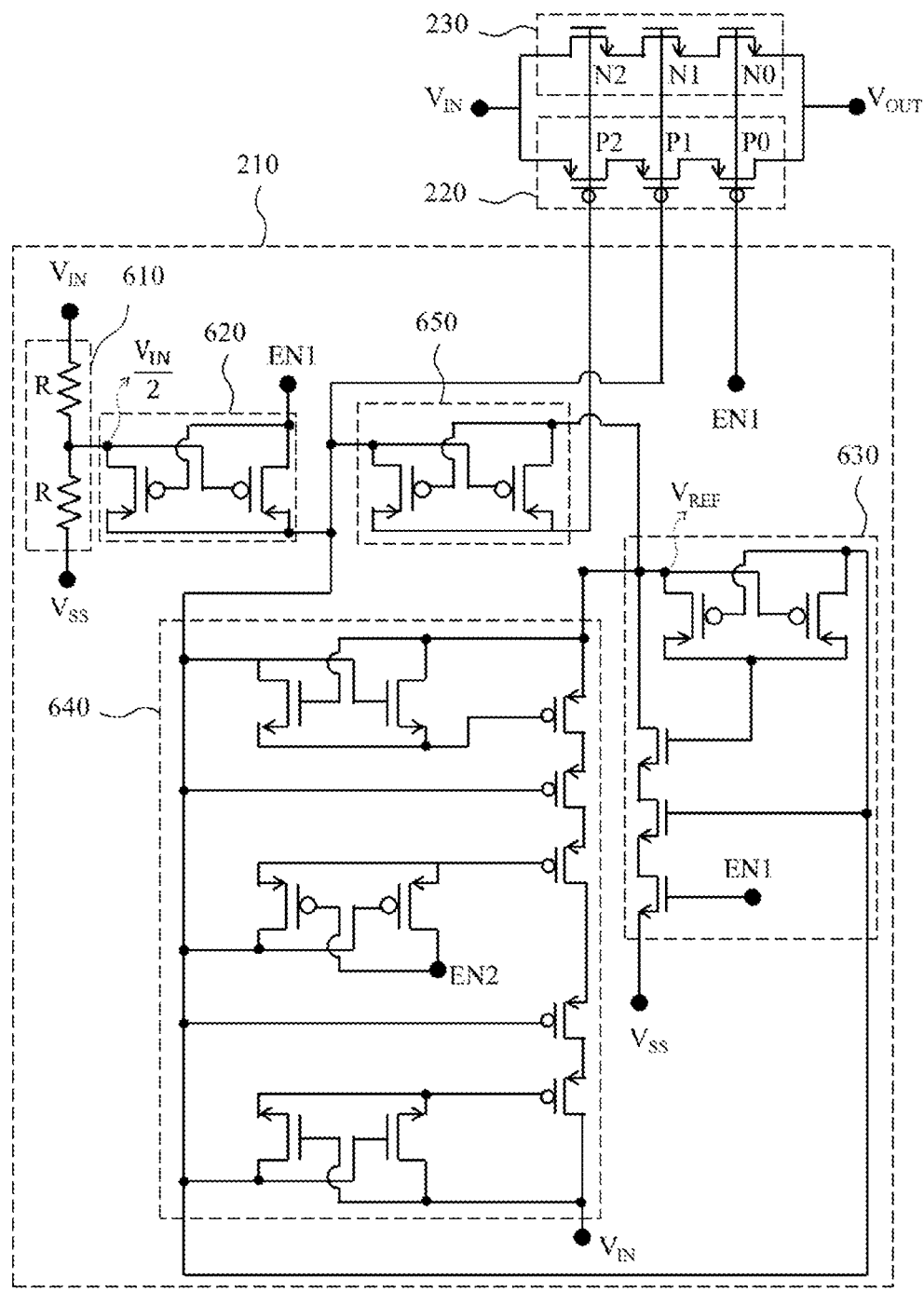
FIG. 6 shows an embodiment of the control voltage generating circuit of FIG. 2.

FIG. 6 shows an embodiment of the control voltage generating circuit 210 of FIG. 2. In FIG. 6, the high voltage transmission circuit 220 includes a plurality of PMOS transistors P2, P1, P0, the low voltage transmission circuit 230 includes a plurality of NMOS transistors N2, N1, N0, each of these PMOS transistors and NMOS transistors is limited to a nominal voltage $V_{NOMINAL}$. In addition, the control voltage generating circuit 210 includes a voltage dividing circuit 610, a first comparing circuit 620, a low level voltage output circuit 630, an input voltage output circuit 640, and a second comparing circuit 650. The voltage dividing circuit 610 includes two identical resistors R and is configured to generate a division voltage $$\frac{V_{IN}}{2}$$

according to the input voltage $V_{IN}$ and the low level voltage $V_{SS}=0$. The first comparing circuit 620 is configured to output the higher one among the division voltage $$\frac{V_{IN}}{2}$$

and a first enable signal EN1 (or output any of the division voltage $$\frac{V_{IN}}{2}$$

and the first enable signal EN1 when they are the same) as the gate voltages of the low level voltage output circuit 630, the input voltage output circuit 640, and the transistors P1, N1. The low level voltage output circuit 630 is configured to determine whether the low level voltage $V_{SS}$ should be outputted as the reference signal $V_{REF}$ according to the first enable signal EN1. The input voltage output circuit 640 is configured to determine whether the input voltage $V_{IN}$ should be outputted as the reference signal $V_{REF}$ according to a second enable signal EN2. The second comparing circuit 650 is configured to output the higher one among the output of the first comparing circuit 620 and the reference signal $V_{REF}$ as the gate voltages of the transistors P2, N2. The first enable signal EN1 is also used as the gate voltages of the transistors P0, N0.

Figure 7:
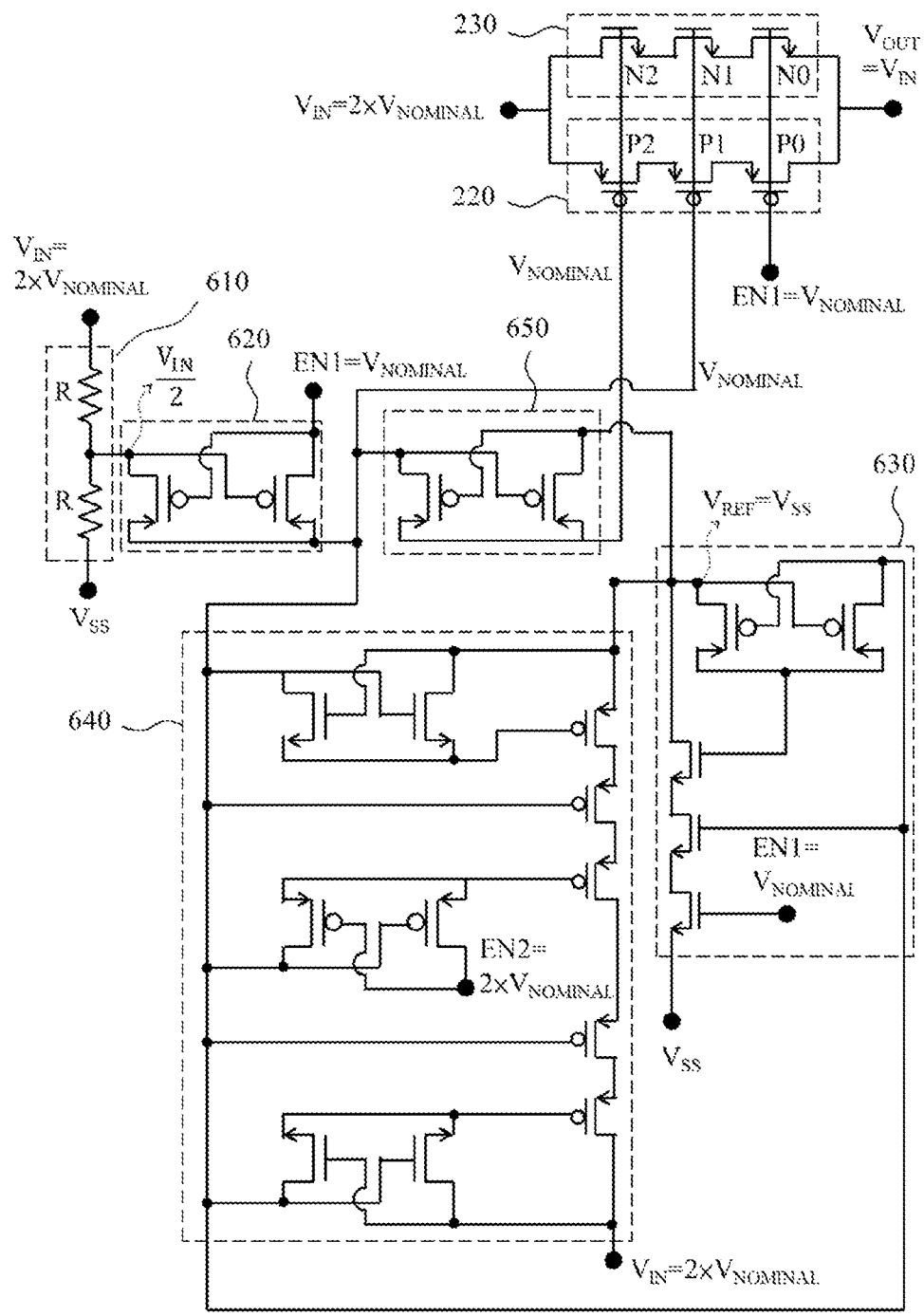
FIG. 7 shows an exemplary implementation of the embodiment of the FIG. 6.

FIG. 7 shows an exemplary implementation of the embodiment of FIG. 6. As shown in FIG. 7, when the input voltage $V_{IN}$ is equal to $V_{DD}=2\times V_{NOMINAL}$ and the enable signal EN includes the first enable signal EN1=$V_{NOMINAL}$ and the second enable signal EN2=$2\times V_{NOMINAL}$ that are at a high voltage level and related to the enable level, the voltage dividing circuit 610 outputs the division voltage $$\frac{V_{IN}}{2} = V_{NOMINAL}.$$

The first comparing circuit 620 outputs any of the division voltage $$\frac{V_{IN}}{2}$$

and the first enable signal EN1

$$\left(\text{i.e., } EN1 = \frac{V_{IN}}{2} = V_{NOMINAL}\right)$$

as the gate voltages of the low level voltage output circuit 630, the input voltage output circuit 640, and the transistors P1, N1. The low level voltage output circuit 630 outputs the low level voltage $V_{SS}$=0 as the reference signal $V_{REF}$ according to the first enable signal EN1=$V_{NOMINAL}$. The input voltage output circuit 640 does not output the input voltage $V_{IN}$ according to the second enable signal EN2=$2\times V_{NOMINAL}$. The second comparing circuit 650 outputs the higher one (i.e., $V_{NOMINAL}$) among the output of the first comparing circuit 620 and the reference signal $V_{REF}$=$V_{SS}$=0 as the gate voltages of the transistors P2, N2. The first enable signal EN1 is also used as the gate voltages (i.e., $V_{NOMINAL}$) of the transistors P0, N0. In light of the above, since the input voltage $V_{IN}$=$2\times V_{NOMINAL}$ is higher than the gate voltages (i.e., $V_{NOMINAL}$) of the PMOS transistors P2, P1, P0, these PMOS transistors P2, P1, P0 are turned on; furthermore, since the input voltage $V_{IN}$=$2\times V_{NOMINAL}$ is higher than the gate voltages (i.e., $V_{NOMINAL}$) of the NMOS transistors N2, N1, N0, these NMOS transistors N2, N1, N0 are turned off. As a result, the voltage difference of any two terminals of each transistor in FIG. 7 is not higher than the nominal voltage $V_{NOMINAL}$.

Figure 8:
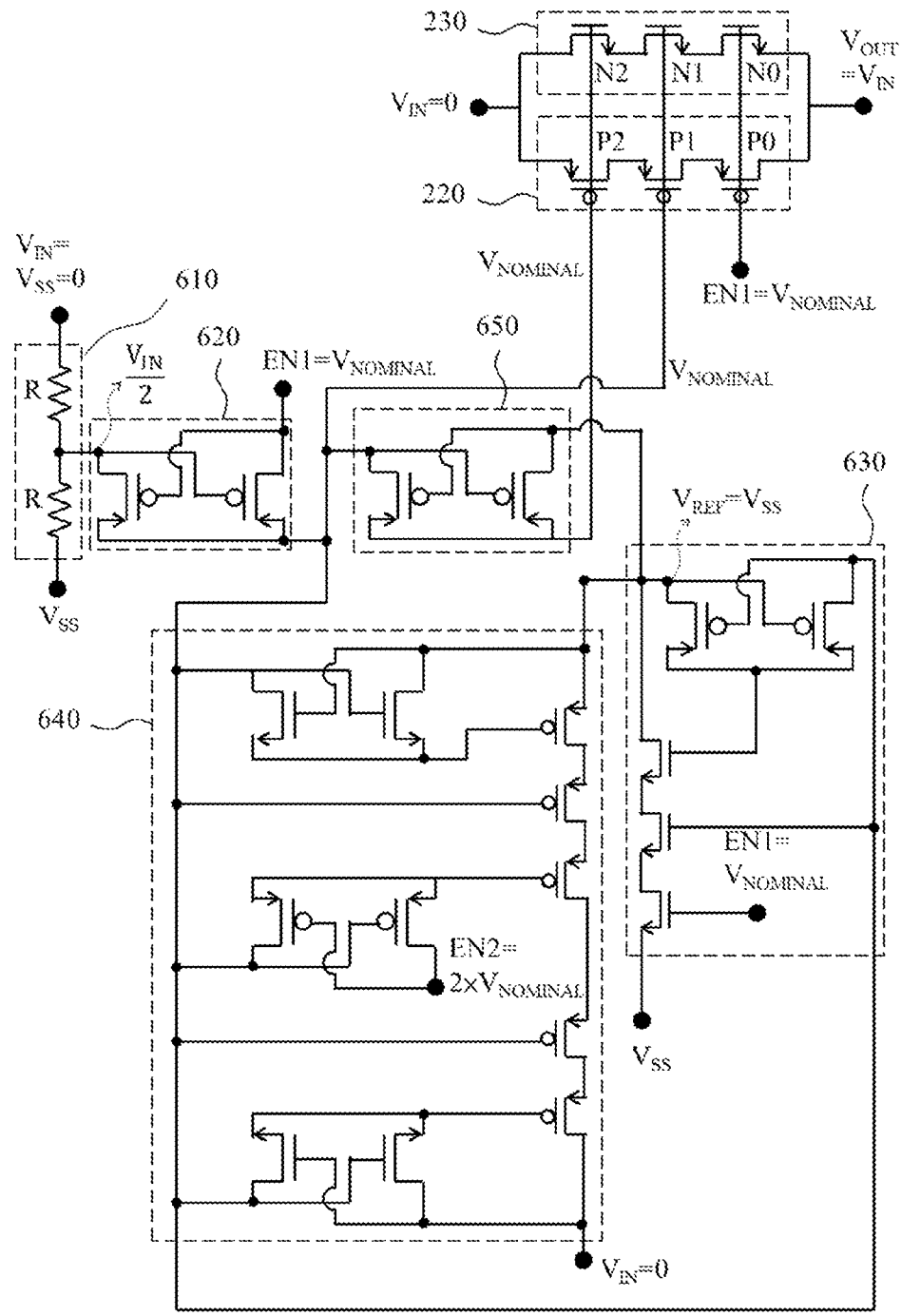
FIG. 8 shows an exemplary implementation of the embodiment of the FIG. 6.

FIG. 8 shows an exemplary implementation of the embodiment of FIG. 6. As shown in FIG. 8, when the input voltage $V_{IN}$ is equal to $V_{SS}$=0 and the enable signal EN includes the first enable signal EN1=$V_{NOMINAL}$ and the second enable signal EN2=$2\times V_{NOMINAL}$ that are at a high voltage level and related to the enable level, the voltage dividing circuit 610 outputs the division voltage $$\frac{V_{IN}}{2} = 0.$$

The first comparing circuit 620 outputs the higher one (i.e., EN1=$V_{NOMINAL}$) among the division voltage $$\frac{V_{IN}}{2}$$

and the first enable signal EN1 as the gate voltages of the low level voltage output circuit 630, the input voltage output circuit 640, and the transistors P1, N1. The low level voltage output circuit 630 outputs the low level voltage $V_{SS}$=0 as the reference signal $V_{REF}$ according to the first enable signal EN1=$V_{NOMINAL}$. The input voltage output circuit 640 does not output the input voltage $V_{IN}$ according to the second enable signal EN2=$2\times V_{NOMINAL}$. The second comparing circuit 650 outputs the higher one (i.e., $V_{NOMINAL}$) among the output of the first comparing circuit 620 and the reference signal $V_{REF}$=$V_{SS}$=0 as the gate voltages of the transistors P2, N2. The first enable signal EN1 is also used as the gate voltages (i.e., $V_{NOMINAL}$) of the transistors P0, N0. In light of the above, since the input voltage $V_{IN}$=0 is lower than the gate voltages (i.e., $V_{NOMINAL}$) of the PMOS transistors P2, P1, P0, these PMOS transistors P2, P1, P0 are turned off; furthermore, since the input voltage $V_{IN}$=0 is lower than the gate voltages (i.e., $V_{NOMINAL}$) of the NMOS transistors N2, N1, N0, these NMOS transistors N2, N1, N0 are turned on. As a result, the voltage difference of any two terminals of each transistor in FIG. 8 is not higher than the nominal voltage $V_{NOMINAL}$.

FIG. 9 shows an exemplary implementation of the embodiment of FIG. 6. As shown in FIG. 9, when the input voltage $V_{IN}$ is equal to $V_{DD}=2\times V_{NOMINAL}$ and the enable signal EN includes the first enable signal EN1=$V_{SS}$=0 and the second enable signal EN2=$V_{SS}$=0 that are at a low voltage level and related to the disablement level, the voltage dividing circuit 610 outputs the division voltage $$\frac{V_{IN}}{2} = V_{NOMINAL}.$$

The first comparing circuit 620 outputs the higher one $$\left(\text{i.e., } \frac{V_{IN}}{2} = V_{NOMINAL}\right)$$

among the division voltage $$\frac{V_{IN}}{2}$$

and the first enable signal EN1 as the gate voltages of the low level voltage output circuit 630, the input voltage output circuit 640, and the transistors P1, N1. The low level voltage output circuit 630 does not output the low level voltage $V_{SS}$ according to the first enable signal EN1=$V_{SS}$=0. The input voltage output circuit 640 outputs the input voltage $V_{IN}$=2× $V_{NOMINAL}$ as the reference signal $V_{REF}$ according to the second enable signal EN2=$V_{SS}$=0. The second comparing circuit 650 outputs the higher one (i.e., 2×$V_{NOMINAL}$) among the output of the first comparing circuit 620 and the reference signal $V_{REF}$=2×$V_{NOMINAL}$ as the gate voltages of the transistors P2, N2. The first enable signal EN1 is also used as the gate voltages (i.e., EN1=$V_{SS}$=0) of the transistors P0, N0. In light of the above, since the input voltage $V_{IN}$=2× $V_{NOMINAL}$ is not higher than the gate voltage (i.e., 2×$V_{NOMINAL}$) of the PMOS transistor P2, the PMOS transistor P2 is turned off; furthermore, since the input voltage $V_{IN}$=2× $V_{NOMINAL}$ is not lower than the gate voltage (i.e., $V_{SS}$=0) of the NMOS transistor N0, the NMOS transistor N0 is turned off; accordingly, the output voltage $V_{OUT}$ is a floating voltage. As a result, the voltage difference of any two terminals of each transistor in FIG. 9 is not higher than the nominal voltage $V_{NOMINAL}$.

People of ordinary skill in the art can derive more exemplary implementations from FIGS. 3~9 and thus repeated and redundant description is omitted here. It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the transmission gate circuit of the present invention can prevent the components of the transmission gate circuit from being damaged by a high voltage (e.g., a power-supply voltage being N times the nominal voltage of the components) and prevent a signal of the input terminal of the transmission gate circuit from being leaked to the output terminal of the transmission gate circuit during a power failure.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit, comprising:
   a control voltage generating circuit configured to generate a plurality of control voltages according to an enable signal and an input voltage of an input terminal, the plurality of control voltages including a first group of control voltages and a second group of control voltages, wherein when the enable signal relates to an enable level, one group of the first group of control voltages and the second group of control voltages includes a plurality of identical voltages, and a voltage difference between any of the identical voltages and any voltage of the other group of the first group of control voltages and the second group of control voltages is not higher than a predetermined voltage, wherein when the enable signal relates to a disablement level, each group of the first group of control voltages and the second group of control voltages includes decremental voltages;
   a high voltage transmission circuit coupled between the input terminal and an output terminal, wherein when the enable signal relates to the enable level and the input voltage is a high level voltage, the high voltage transmission circuit is turned on according to the first group of control voltages including the identical voltages and has an output voltage of the output terminal be equal to the input voltage of the input terminal, wherein when the enable signal relates to the disablement level, the high voltage transmission circuit is turned off according to the first group of control voltages; and
   a low voltage transmission circuit coupled between the input terminal and the output terminal, wherein when the enable signal relates to the enable level and the input voltage is a low level voltage, the low voltage transmission circuit is turned on according to the second group of control voltages including the identical voltages and has the output voltage of the output terminal be equal to the input voltage of the input terminal, and wherein when the enable signal relates to the disablement level, the low voltage transmission circuit is turned off according to the second group of control voltages.

2. The circuit of claim 1, wherein the predetermined voltage is a nominal voltage of a transistor.

3. The circuit of claim 1, wherein when the enable signal relates to the disablement level, the first group of control voltages is equal to the second group of control voltages.

4. The circuit of claim 1, wherein when the enable signal relates to the enable level and the input voltage is the high level voltage, the low voltage transmission circuit is turned off according to the second group of control voltages, and when the enable signal relates to the enable level and the input voltage is the low level voltage, the high voltage transmission circuit is turned off according to the first group of control voltages.

5. The circuit of claim 4, wherein the high voltage transmission circuit and the low voltage transmission circuit are coupled in parallel.

6. The circuit of claim 1, wherein the high voltage transmission circuit includes first-type transistors, the low voltage transmission circuit includes second-type transistors, each of the first-type transistors and the second-type transistors is limited to a nominal voltage.

7. The circuit of claim 6, wherein the high level voltage is between N times the nominal voltage and (N+1) times the nominal voltage, and the N is an integer greater than one.

8. The circuit of claim 7, wherein a number of the first-type transistors is (N+1) and a number of the second-type transistors is (N+1).

9. The circuit of claim 7, wherein a voltage difference between any two terminals of each of the first-type transistors and the second-type transistors is not higher than the nominal voltage.

10. The circuit of claim 7, wherein a voltage difference between any two successive voltages of the decremental voltages is equal to the nominal voltage.

11. The circuit of claim 6, wherein a voltage difference between any two terminals of each of the first-type transistors and the second-type transistors is not higher than the nominal voltage.

12. The circuit of claim 6, wherein a voltage difference between any two successive voltages of the decremental voltages is equal to the nominal voltage.

13. The circuit of claim 6, wherein when the enable signal relates to the enable level and the input voltage is the high level voltage, the first group of voltages includes the identical voltages and each of the identical voltages is equal to the high level voltage minus the nominal voltage.

14. The circuit of claim 6, wherein when the enable signal relates to the enable level and the input voltage is the low level voltage, the second group of voltages includes the identical voltages and each of the identical voltages is equal to the nominal voltage.

15. The circuit of claim 6, wherein when the enable signal relates to the enable level and the input voltage is the high level voltage, the first group of voltages includes the identical voltages being a plurality of first voltages; when the enable signal relates to the enable level and the input voltage is the low level voltage, the second group of voltages includes the identical voltages being a plurality of second voltages; and the plurality of first voltages are different from the plurality of second voltages.

16. A circuit, comprising:
a control voltage generating circuit configured to generate a plurality of control voltages according to an enable signal and an input voltage of an input terminal, the plurality of control voltages including a first group of control voltages and a second group of control voltages;
a high voltage transmission circuit coupled between the input terminal and an output terminal, wherein when the enable signal relates to an enable level and the input voltage is a high level voltage, the high voltage transmission circuit is turned on according to the first group of control voltages so that an output voltage of the output terminal is equal to the input voltage of the input terminal while a low voltage transmission circuit is turned off according to the second group of control voltages, and wherein when the enable signal relates to a disablement level, the high voltage transmission circuit is turned off according to the first group of control voltages that are decremental; and
the low voltage transmission circuit coupled with the high voltage transmission circuit in parallel and coupled between the input terminal and the output terminal, wherein when the enable signal relates to the enable level and the input voltage is a low level voltage, the low voltage transmission circuit is turned on according to the second group of control voltages so that the output voltage of the output terminal is equal to the input voltage of the input terminal while the high voltage transmission circuit is turned off according to the first group of control voltages, and wherein when the enable signal relates to the disablement level, the low voltage transmission circuit is turned off according to the second group of control voltages that are decremental.

17. The circuit of claim 16, wherein the high voltage transmission circuit includes first-type transistors, the low voltage transmission circuit includes second-type transistors, each of the first-type transistors and the second-type transistors is limited to a nominal voltage, the high level voltage is between N times the nominal voltage and (N+1) times the nominal voltage, and the N is an integer greater than one.

18. The circuit of claim 17, wherein a voltage difference between any two terminals of each of the first-type transistors and the second-type transistors is not higher than the nominal voltage.

* * * * *